United States Patent [19]

Minner

[11] 4,300,058
[45] Nov. 10, 1981

[54] ELECTRONIC SWITCH FOR CONVERTING A PULSE SIGNAL INTO AN ANALOG SIGNAL

[75] Inventor: Willy Minner, Schwaigern, Fed. Rep. of Germany

[73] Assignee: Licentia Patent-Verwaltungs-G.m.b.H., Frankfurt am Main, Fed. Rep. of Germany

[21] Appl. No.: 26,540

[22] Filed: Apr. 2, 1979

Related U.S. Application Data

[63] Continuation of Ser. No. 742,686, Nov. 17, 1976.

[30] Foreign Application Priority Data

Nov. 19, 1975 [DE] Fed. Rep. of Germany ....... 2551813

[51] Int. Cl.³ .............................................. H03K 5/00
[52] U.S. Cl. .................................... 307/261; 307/310
[58] Field of Search ................. 307/233 R, 234, 228, 307/310, 247, 294, 296 A, 240, 255, 246, 261

[56] References Cited

U.S. PATENT DOCUMENTS

| | | | |
|---|---|---|---|
| 3,048,712 | 8/1962 | Alm | 307/295 X |
| 3,544,994 | 12/1970 | Hanson et al. | 340/347 DA |
| 3,750,141 | 7/1973 | Poretti et al. | 340/347 DA |
| 3,770,986 | 11/1973 | Drehle | 307/255 X |
| 3,790,823 | 2/1974 | Briley | 307/243 X |
| 3,814,954 | 6/1974 | Cake | 307/246 X |
| 3,840,754 | 10/1974 | Okada et al. | 307/255 X |
| 3,928,774 | 12/1975 | Wilson | 307/255 X |
| 4,002,927 | 1/1977 | Nakamura et al. | 307/246 |

OTHER PUBLICATIONS

Schmid, Electronic Analog/Digital Conversions, Van Nostrand Reinhold Co., 1970, pp. 204–216.
Wait et al., Introduction To Operational Amplifier Theory and Applications, McGraw-Hill Book Co., 1975, pp. 40,41.
Reintjes et al., Principles of Radar, McGraw-Hill Book Co., 1952, pp. 349–351.
Landee et al., Electronic Designers' Handbook, McGraw-Hill Book Co., 1957, pp. 19-13 & 19-14.

Primary Examiner—Thomas J. Sloyan
Attorney, Agent, or Firm—Spencer & Kaye

[57] ABSTRACT

An electronic switch for converting a pulse signal into a continuous analog signal by connecting a d.c. voltage to an integrating circuit under the control of pulses of the pulse signal comprising two switching elements connected by a voltage divider, and lying between the poles of the d.c. voltage source, the divider ratio being selected to compensate the effects on the analog output signal at the output of the integrating circuit of temperature dependence of the switching elements.

7 Claims, 4 Drawing Figures

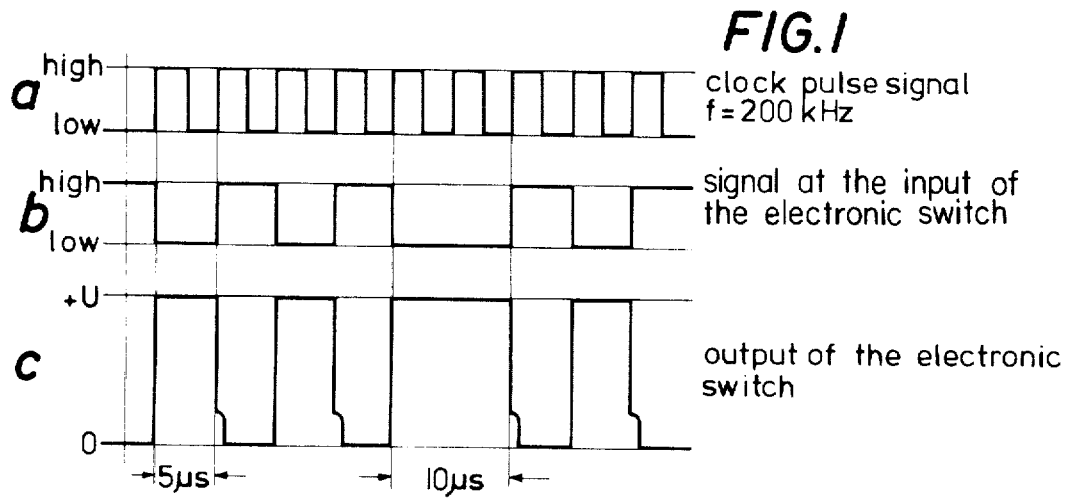
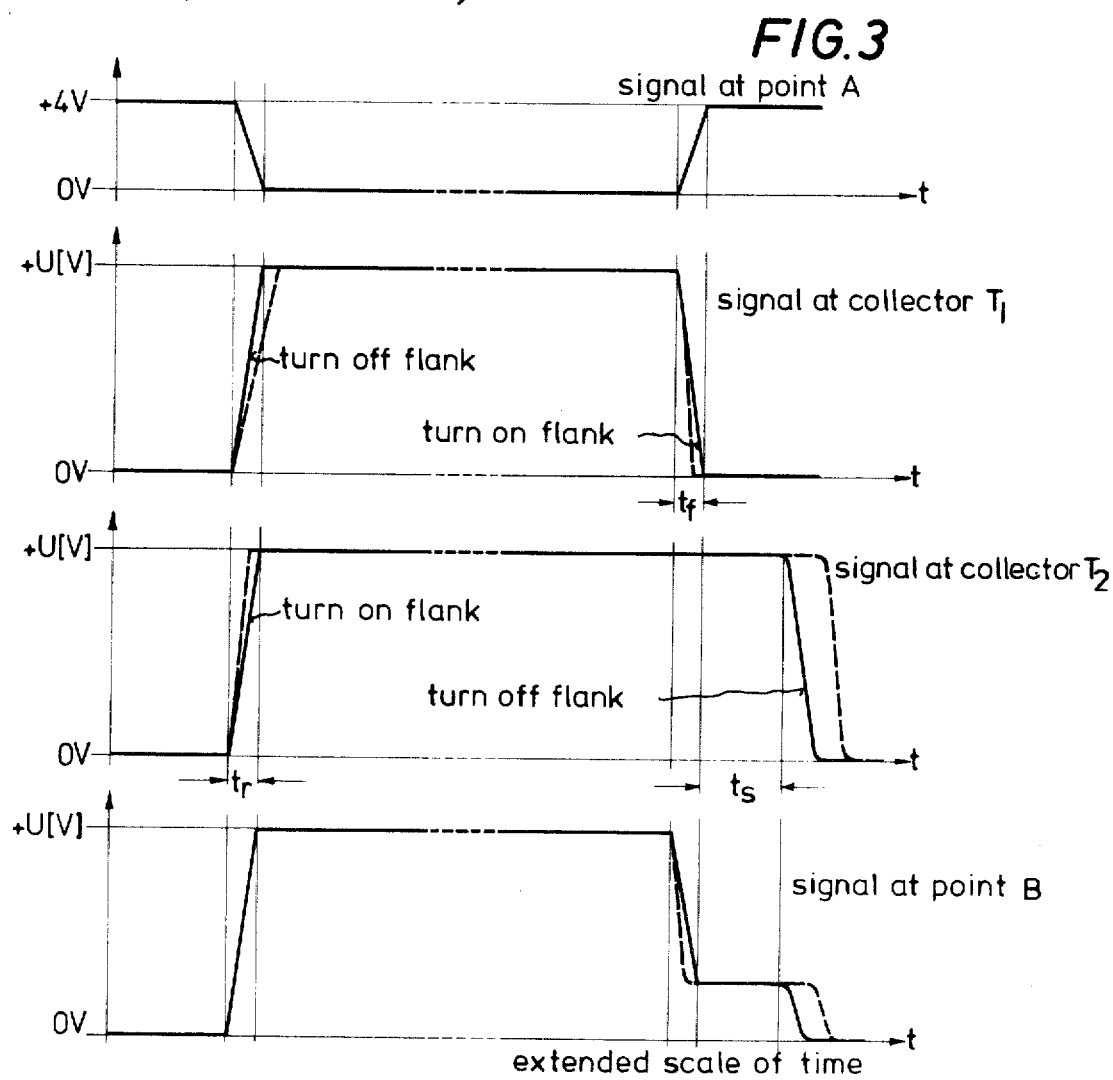

4,300,058

ELECTRONIC SWITCH FOR CONVERTING A PULSE SIGNAL INTO AN ANALOG SIGNAL

CROSS REFERENCE TO RELATED APPLICATION

This application is a continuation of application Ser. No. 742,686, filed Nov. 17th, 1976.

BACKGROUND OF THE INVENTION

The invention relates to a largely temperature stable electronic switch for use as the input member of a circuit for converting a pulse signal into a continuous analog signal having an amplitude representative of the duty cycle of the pulse signal. For the purpose of conversion, pulse signals are supplied to an electronic switch, the pulses having a pulse duration $\tau$ and a period duration T. The electronic switch connects a d.c. voltage U to an integrating element, controlled by these pulses, at the output of which element an analog signal $U_M$ with the size $$U_M = (\tau/T) \cdot U$$

is obtained.

For certain applications, e.g. for the purpose of producing a tuning d.c. voltage for electronic tuners in television devices, the analog signal $U_M$ must be varied in relatively small steps; in this example the steps are 1/10 000th of the d.c. voltage U. As a result of integrated circuit technology, the minimum pulse duration $\tau$ is, for example, 5 µsec. For stability of the analog signal $U_M$ in relation to the temperature demands $$\Delta U_M \approx U_M/1000 \quad \Big| \quad \Delta T = 20 \ldots 50° C.$$

are made within an operating temperature range of 20° ... 50° C. so that the pulse duration $\tau$ may not vary within the stated temperature range more than 1/1000th $\tau$ corresponding to $\Delta\tau = 5$ nsec. This makes extremely high demands on temperature stability of the electronic switch.

SUMMARY OF THE INVENTION

It is an object of the invention to provide a circuit for an electronic switch which overcomes the dependence on temperature of known electronic switches as extensively as possible.

According to the invention, there is provided an electronic switch for use in a circuit for converting a pulse signal into a continuous analog signal by connecting a d.c. voltage to an integrating circuit under the control of pulses of the pulse signal, said switch comprising a first switching element with a first switchable path, a voltage divider connected by one end to said first switchable path, a second switching element with a second switchable path connected to the other end of said voltage divider with said switchable paths and said voltage divider lying between the poles of the d.c. voltage and with the divider ratio of said voltage divider compensating the effects on the analog output signal at the output of the integrating circuit, connected to said voltage divider, of temperature dependence of said first and second switching elements.

Further according to the invention, there is provided an electronic switch for the same purpose, which connects a d.c. voltage to an integrating element in time with the sequence frequency of a pulse signal, characterized in that the operable path of a first switching element, a voltage divider and the operable path of a second switching element lie between the poles of the d.c. voltage source; and that the divider ratio of the voltage divider is selected such that the effects of the temperature dependence of the first and second switching element on the analog signal at the output of the integrating element connected to the voltage divider is compensated.

Still further according to the invention, there is provided a circuit for converting a pulse signal into an analog signal comprising a d.c. voltage source, an electronic switch, a switching path for said electronic switch, connected between the poles of said d.c. voltage source, a first switching element for said electronic switch, a second switching element for said electronic switch and a voltage divider connecting said first and second switching elements, an integrating circuit connected to said electronic switch to provide an analog output signal with the temperature dependence of said first and second switching elements compensated for by the said voltage divider.

BRIEF DESCRIPTION OF THE DRAWINGS

The invention will now be described in greater detail, by way of example, with reference to the drawings in which:

FIG. 1 is a graphical representation of the course of various signals in the circuit of FIG. 2.

FIG. 3 is a further graphical representation of signals in the circuit of the invention.

DESCRIPTION OF THE PREFERRED EMBODIMENTS

Figure 2:
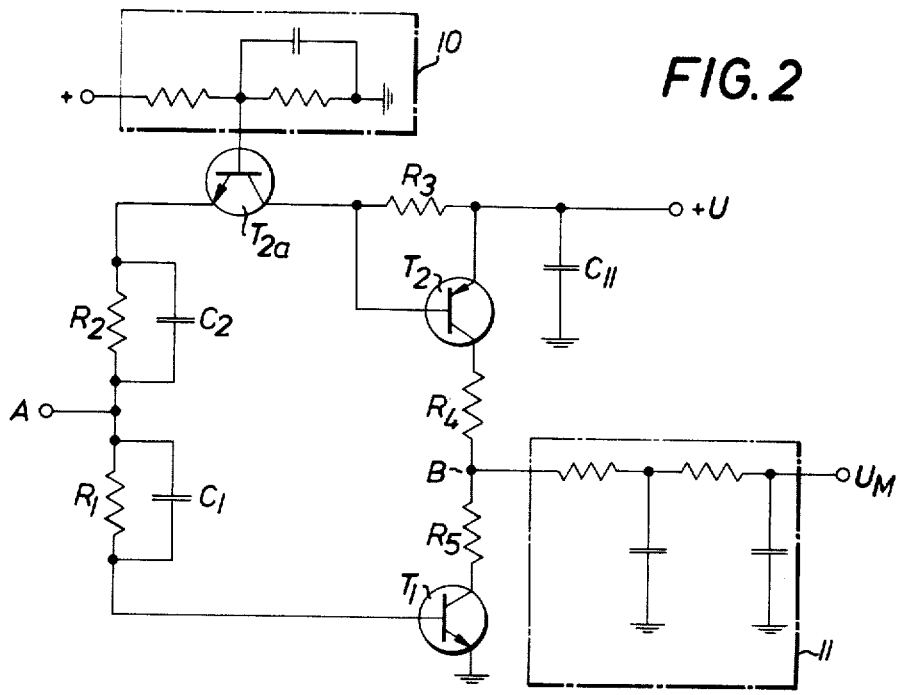
FIG. 2 is a circuit diagram of an embodiment of an electronic switch according to the invention.

At line (a), FIG. 1 shows a clock pulse signal with the clock frequency of 200 kHz, for example, for a control circuit connected ahead of the input member of an electronic switch, a pulse signal controlled by those pulses is shown for a discrete analog voltage $U_M$ at line (b). This pulse signal lies at the input of the electronic switch, at point A in FIG. 2. Line (c) of FIG. 1 shows the output signal of the electronic switch in outline at point B. The mode of operation of the electronic switch will be described in greater detail with the aid of FIG. 2.

The input signal to the electronic switch (FIG. 1, line b) is applied at the point A at the levels "Low"=0 V and "High"=+4 V. The "High" pulse becomes effective via $R_1 C_1$ (RC element) at the base of the transistor $T_1$ which is of the NPN type, it controls this transistor into saturation so that its collector potential almost equals the emitter potential—thus 0 V. The flank of the input pulse becomes completely effective at the base of the transistor $T_1$ via $C_1$, whereby the transistor is unblocked very rapidly and is held in the unblocked position by the current which is determined by the resistor $R_1$.

The "High" pulse lying at point A cannot reach the transistor $T_2$ of the PNP type because the base of the previously connected transistor $T_{2a}$ of the NPN type is fixed at a d.c. voltage potential by the blocked off voltage divider 10, which potential corresponds approximately to half the amplitude of the "High" pulse (in the example +2 V). The transistor $T_2$ remains open, i.e. isolating point B from the d.c. voltage source U, which is blocked off by $C_{11}$, if there is no current flowing to the point B of the circuit.

A "Low" signal at point A becomes effective at the base of the transistor $T_1$ very rapidly via $R_1C_1$ and clears away its charge whereby $T_1$ is non-conductive and its collector accepts the potential at point B. The "Low" signal controls the transistor $T_{2a}$ via $R_2C_2$ and thus controls transistor $T_2$ in the flow direction whereby the collector of the transistor $T_2$ is, in practice, brought to the emitter potential, thus to the voltage +U. The flank of the input pulse becomes completely effective via $C_2$ at the emitter of the transistor $T_{2a}$ and thus also at the base of the transistor $T_2$, whereby the transistor $T_2$ is very rapidly unblocked and is held in the unblocked state by the current which is determined by the resistor $R_2$.

A "High" signal following a "Low" signal becomes effective, as described, at transistor $T_1$, i.e. the signal is made steeper by $C_1$. This "High" signal in fact blocks transistor $T_{2a}$, also made steeper via $C_2$, into the currentless state, yet not transistor $T_2$ whose base charge may only flow away via the resistor $R_3$ whereby the storage time of the transistor $T_2$ becomes effective. The voltage curves shown in FIG. 3 are produced at the collectors of the transistors $T_1$ and $T_2$ (solid curves). Switching from 0 volts up to the voltage +U takes place at the collectors of the transistors $T_1$ and $T_2$ at almost the same steepness during the time $t_r$. While disconnection of +U to 0 V takes place at the collector $T_1$ at $t_f \approx t_r$, the storage time of the transistor $T_2$ becomes effective at the collector and disconnection takes place only after the time $t_s$.

As described at the outset, the transistor $T_1$ is switched from "High" to "Low" during exchange of the signal at point A, while, the transistor $T_2$ is unblocked. When there is a change in the surrounding temperature for this switching condition it is observed that, with increasing heating of the transistors, the steepness of the turn on flank increases and the steepness of the turn off flank decreases (shown in broken lines). When there is a change in the signal at point A from "Low" to "High" then it is evident, with an increase in the surrounding temperature, that the steepness of the turn on flank increases and the storage time of the turn off flank substantially increases (indicated in broken lines).

If the collectors of the transistors are not directly connected but are connected via a voltage divider comprising the resistors $R_4$ and $R_5$ and if the integrating element 11 is connected to the voltage divider point B, then with a suitable choice of the resistance value, the temperature dependence of the electronic switch may be eliminated as indicated in the last line of FIG. 3 (signal at point B) (broken line signal curve at increased temperature).

Figure 4:
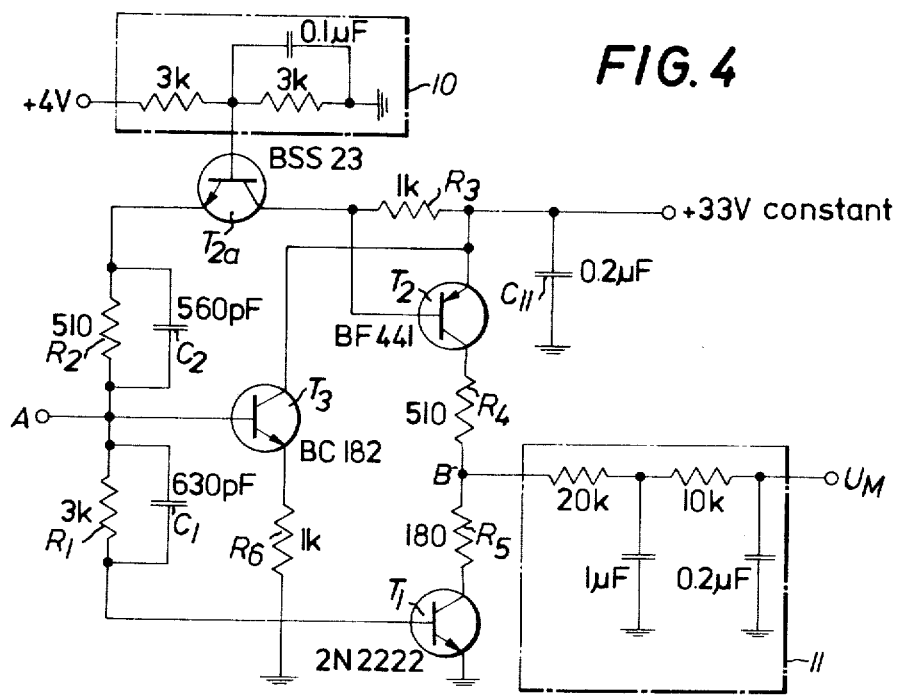
FIG. 4 is a circuit diagram of a specific tested circuit in accordance with the invention.

With the tested circuit of FIG. 4, in which a further transistor $T_3$ having an emitter resistor $R_6$ is connected up which holds the current load of the d.c. voltage source U extensively constant independent of the analog value selected, the change in the voltage $U_M$ of the analog signal at the output of the integrating element is no more than $1/3000 \triangleq 0.033\%$ referring to $U_M$ when there is a surrounding temperature between 20° C. and 50° C. Thus the clock pulse was chosen at 200 kHz, the pulses supplied to the electronic switch were chosen at a pulse duration of $\tau = 5$ μsec and the d.c. voltage U was chosen at 33 V. The width of the step of the analog signal $\Delta U_M$ was 3.3 mV.

When testing the circuit in accordance with the invention a further advantage became evident i.e. that by incorporating the storage time $t_s$ into the analog value, the frequency dependence brought about by the propagation time in the switch is reduced. A change in the clock pulse frequency by ±10% merely causes a change in the analog voltage value by ±0.05% at the output of the integrating element.

It will be understood that the above description of the present invention is susceptible to various modification changes and adaptations.

What is claimed is:

1. An electronic switch for use in a circuit for converting a pulse signal into a continuous analog signal by connecting a d.c. voltage to an integrating circuit under the control of pulses of the pulse signal, said switch comprising a first switching transistor with a first switchable path, a voltage divider connected by one end to said first switchable path, and a second switching transistor of opposite semiconductor type to said first transistor, with a second switchable path connected to the other end of said voltage divider each said path having a temperature-dependent switching characteristic, with said switchable paths and said voltage divider lying between the poles of the d.c. voltage, and wherein said voltage divider includes at least two impedances each connected between a respective switching transistor and a point of said divider intermediate its ends, providing the input for the integrating circuit, with the values of said impedances being selected for giving said divider a divider ratio, with respect to said point intermediate its ends, for causing the volt-second narrowing of the pulse output on the collector of one said transistor with increasing temperature to be at least partly offset by the corresponding volt-second widening of the pulse output on the collector of the other said transistor at said point intermediate the ends of said divider, thereby to effect compensation of the effects on the analog output signal at the output of the integrating circuit, connected to said voltage divider, of temperature dependence of the switching characteristics of said paths of said first and second switching transistors.

2. A circuit including an integrating element and an electronic switch for connecting a d.c. voltage to the integrating element under control of a pulse signal, in order to convert the pulse signal into a continuous analog signal at the output of the integrating element, said switch comprising first and second switching transistors of mutually complementary semiconductor types, each presenting a switchable current path having a temperature-dependent switching characteristic; a voltage divider connected between said first and second transistors to form a series circuit with said current paths of said first and second transistors; and a source of such d.c. voltage having two poles each connected to a respective end of said series circuit, and said integrating element having its input connected to said voltage divider at a point intermediate its ends; and wherein said voltage divider includes at least two impedances each connected between a respective switching transistor and the input of said integrating element, with the values of said impedances being selected for giving said divider a divider ratio, with respect to said point intermediate its ends, for causing the volt-second narrowing of the pulse output on the collector of one said transistor with increasing temperature to be at least partly offset, at said integrating element input, by the corresponding volt-second widening of the pulse output on the collector of the other said transistor, thereby to effect compensation for the temperature dependence of the switching characteristics of said current paths of said switching transistors at the output of said integrating element.

3. An arrangement as defined in claim 2, wherein said first switching transistor is connected to be rendered conductive by a high pulse signal value and said second switching transistor is connected to be rendered conductive by a low pulse signal value.

4. An arrangement as defined in claim 2, and comprising a third transistor connected for keeping the current loading of said d.c. voltage source extensively constant independent of variations in the analog value.

5. An arrangement as defined in claim 2, comprising a further transistor connected ahead of one of said switching transistors for isolating said one switching element from pulse signal portions which render the other said switching transistor conductive.

6. An arrangement as defined in claim 4 wherein said third transistor has its collector-emitter path connected between said poles of said d.c. voltage source through an emitter resistor, and has its base connected to the input of said electronic switch.

7. An arrangement as defined in claim 5 comprising a blocked off voltage divider connected for keeping the base of said further transistor at a predetermined d.c. voltage potential.

* * * * *